(12) United States Patent
Yasuda et al.

(10) Patent No.: US 8,710,482 B2
(45) Date of Patent: Apr. 29, 2014

(54) MEMORY COMPONENT AND MEMORY DEVICE

(75) Inventors: Shuichiro Yasuda, Kanagawa (JP); Katsuhisa Aratani, Aichi (JP); Kazuhiro Ohba, Miyagi (JP); Hiroaki Sei, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 13/004,976

(22) Filed: Jan. 12, 2011

(65) Prior Publication Data

US 2011/0175049 A1 Jul. 21, 2011

(30) Foreign Application Priority Data

Jan. 19, 2010 (JP) ................................. 2010-009457

(51) Int. Cl.
*H01L 47/00* (2006.01)
*H01L 29/04* (2006.01)

(52) U.S. Cl.
USPC ............................ 257/4; 257/3; 257/E45.003

(58) Field of Classification Search
USPC ........... 257/2–5, E21.004, E45.002, E45.003, 257/E47.001; 438/382, 468, 510
See application file for complete search history.

(56) References Cited

U.S. PATENT DOCUMENTS

| 5,761,115 | A | 6/1998 | Kozicki et al. | |
|---|---|---|---|---|
| 2008/0083918 | A1* | 4/2008 | Aratani et al. | 257/5 |
| 2009/0180314 | A1* | 7/2009 | Liu | 365/163 |
| 2009/0231911 | A1* | 9/2009 | Liu et al. | 365/163 |
| 2009/0302293 | A1* | 12/2009 | Morikawa et al. | 257/2 |
| 2010/0259967 | A1* | 10/2010 | Yasuda et al. | 365/148 |
| 2010/0291748 | A1* | 11/2010 | Dressler et al. | 438/384 |
| 2010/0314601 | A1* | 12/2010 | Lee | 257/4 |

FOREIGN PATENT DOCUMENTS

| CN | 1697195 A | 11/2005 |
|---|---|---|
| CN | 1989619 A | 6/2007 |
| JP | 2006-196537 | 7/2006 |
| JP | 2008-224711 | 9/2008 |
| TW | 200915561 A | 4/2009 |

OTHER PUBLICATIONS

Akihito Sawa; Resistive switching in transition metal oxides; Materials Today; Jun. 2008; vol. 11, No. 6.
Krzysztof Szot et al.; Switching the electrical resistance of individual dislocations in single-crystalline SrTiO3; Nature Materials; Apr. 2006; vol. 5.
Chinese Office Action issued in connection with related CN Patent Application No. CN 201110005533.5 dated Dec. 31, 2013.
Japanese Office Action issued in connection with related Japanese patent application No. 2010-009457 dated Feb. 26, 2014.

* cited by examiner

*Primary Examiner* — Daniel Luke
*Assistant Examiner* — Khaja Ahmad
(74) *Attorney, Agent, or Firm* — Dentons US LLP

(57) ABSTRACT

A memory component includes: a first electrode; a memory layer; and a second electrode in this order, wherein the memory layer includes a high resistance layer which includes tellurium (Te) as the chief component among anion components and is formed on the first electrode side; and an ion source layer which includes at least one kind of metal element and at least one kind of chalcogen element among tellurium (Te), sulfur (S) and selenium (Se) and is formed on the second electrode side.

14 Claims, 10 Drawing Sheets

EXAMPLE 1

EXAMPLE 2

EXAMPLE 3

EXAMPLE 4

EXAMPLE 5

FIG. 7A
COMPARATIVE EXAMPLE 1
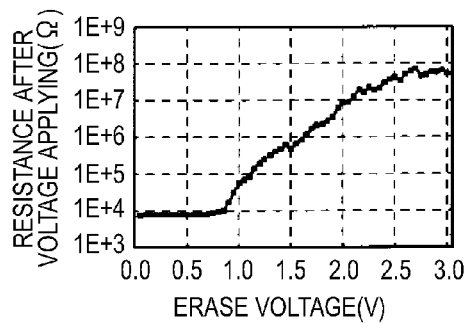
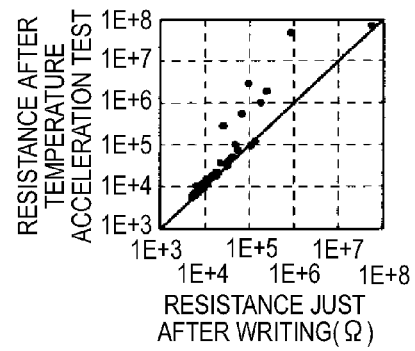
FIG. 7B
COMPARATIVE EXAMPLE 2
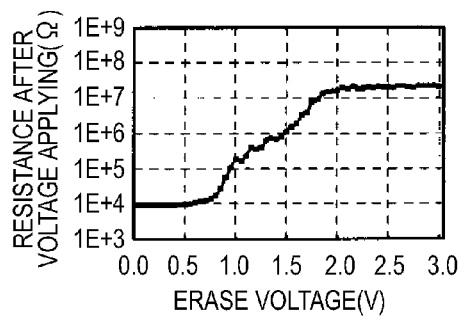
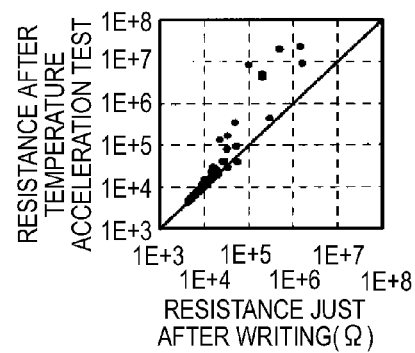
FIG. 7C
COMPARATIVE EXAMPLE 3
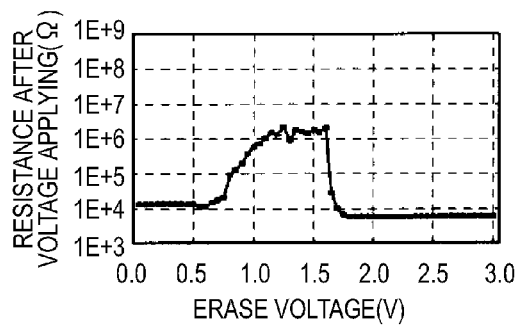
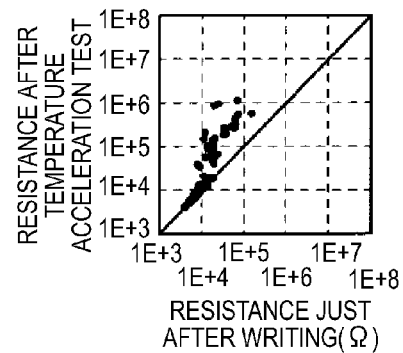

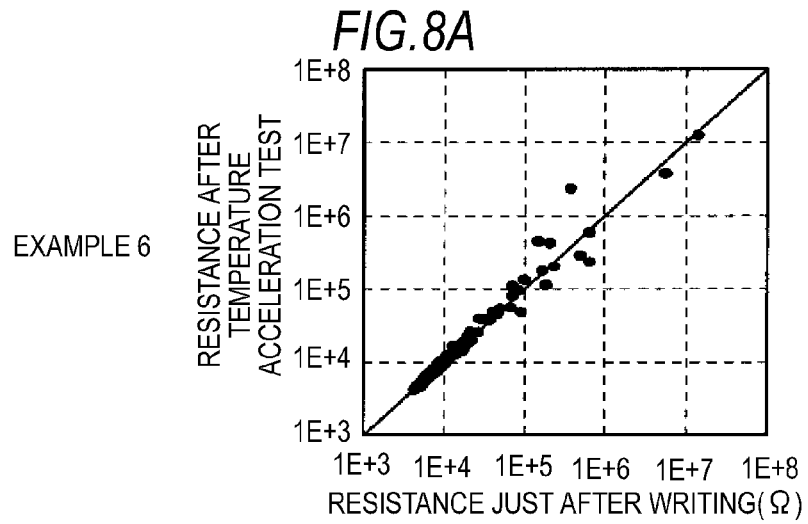
FIG.8A EXAMPLE 6
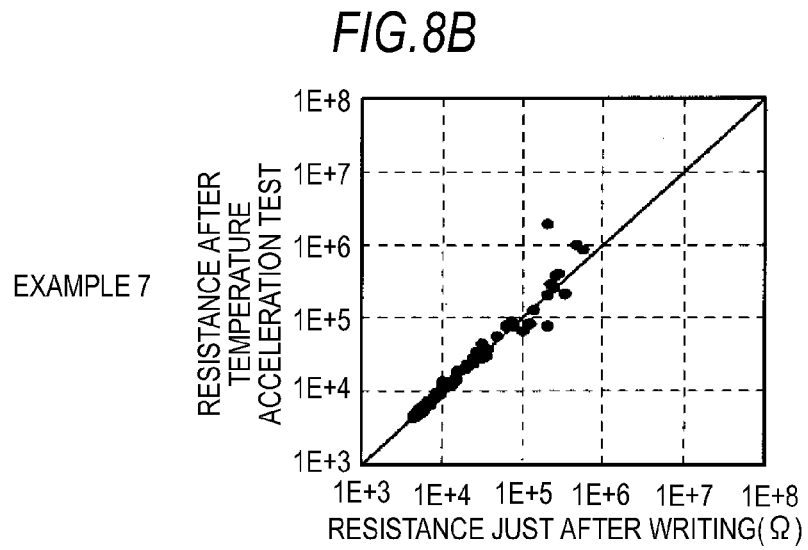
FIG.8B EXAMPLE 7
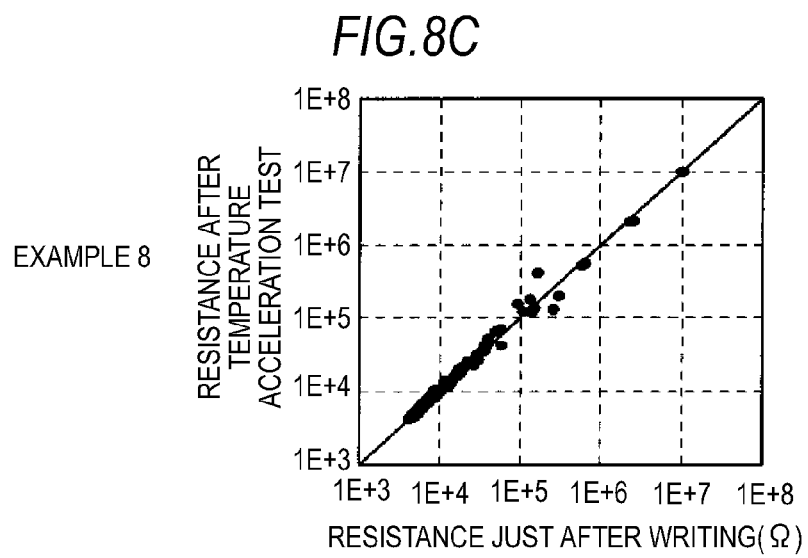
FIG.8C EXAMPLE 8

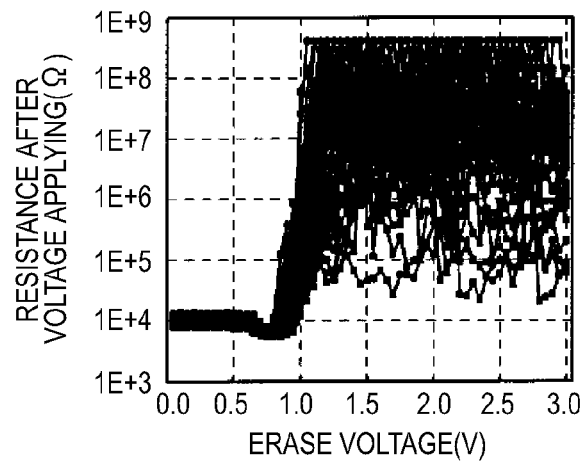
FIG.9A EXAMPLE 6
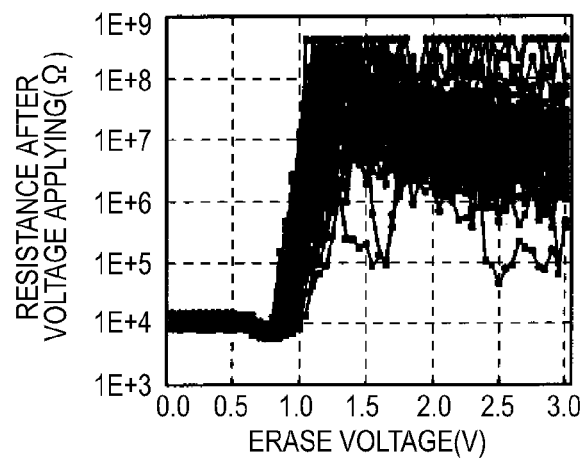
FIG.9B EXAMPLE 7
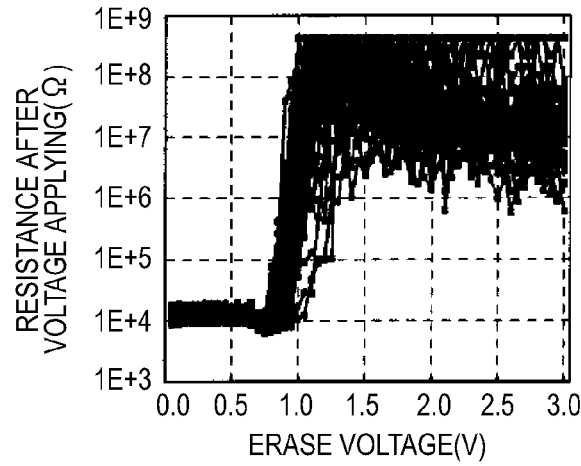
FIG.9C EXAMPLE 8

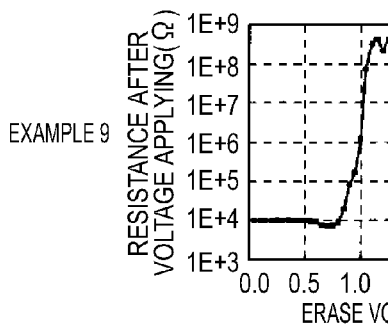
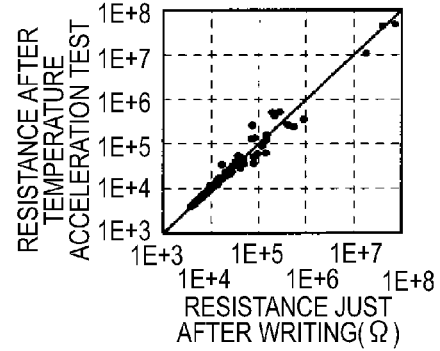
FIG.11A
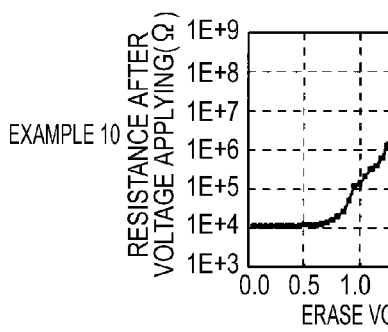
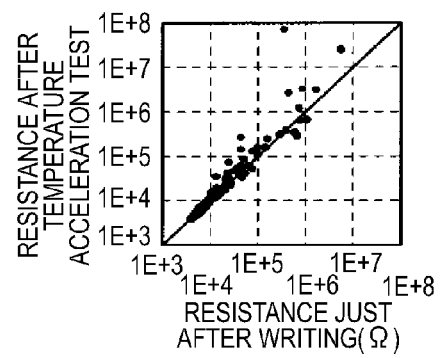
FIG.11B
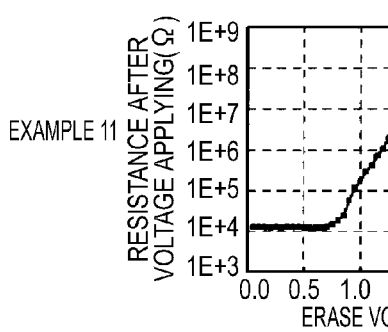
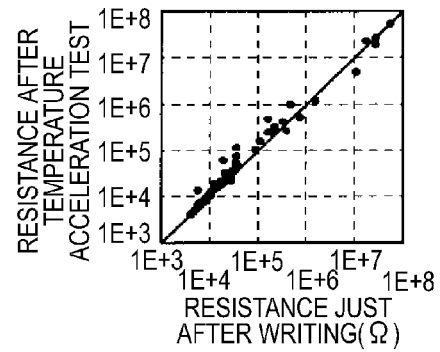
FIG.11C
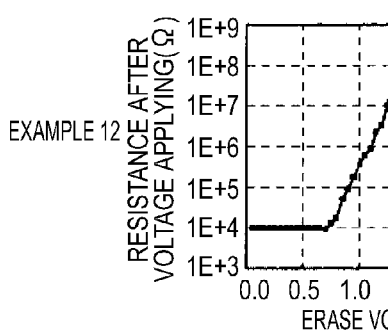
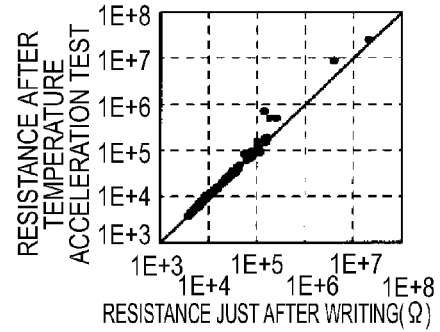
FIG.11D

MEMORY COMPONENT AND MEMORY DEVICE

BACKGROUND OF THE INVENTION

1. Field of the Invention

The present invention relates to a memory component and a memory device, which store information in accordance with a change of the electrical characteristics of a memory layer that includes an ion source layer and a high resistance layer.

2. Description of the Related Art

As semiconductor nonvolatile memories for data storage, NOR type or NAND type flash memories are generally used. According to these semiconductor nonvolatile memories, however, a large voltage is necessary for write and erase operations, and the number of electrons that are injected into a floating gate is limited causing a limit on the miniaturization of the memory.

Recently, resistance change type memories, such as ReRAM (Resistance Random Access Memory), PMC (Programmable Metallization Cell), or the like, have been proposed as next-generation nonvolatile memories that can overcome the limit on miniaturization (for example, Nature Material 1614 p312 (2006), U.S. Pat. No. 5,761,115 Jun. 2, 1998 Axon, and Sawa Materials today 11 28 (2008)). These memories have a simple structure provided with a resistance change layer between two electrodes. Also, according to a memory disclosed in JP-A-2006-196537, an ion source layer and an oxide film (thin film for memory) are provided between a first electrode and a second electrode instead of the resistance change layer. In these resistance change type memories, it is considered that atoms or ions move according to heat or electric fields and thus a conduction path is formed to change the resistance value.

However, in order to realize a large capacity in the resistance change type nonvolatile memory through a front-end semiconductor process, low-voltage and low-current operation is necessary. This is because as driving transistors are miniaturized, their driving current and voltage become lowered. That is, in order to realize a miniaturized resistance change type nonvolatile memory, it is necessary that the memory has a function capable of being driven by miniaturized transistors. In addition, in order to realize a low-current operation, it is also necessary to maintain a resistance state (data) that is rewritten at low current and high speed (short pulse on the nanosecond order).

SUMMARY OF THE INVENTION

As this kind of memory in the related art, for example, there is a memory having a structure of "lower electrode/GdOx/CuZrTeAlGe/upper electrode". In this memory having such a configuration, under conditions where a rewrite current value is equal to or more than 100 μA, the operation speed and data maintenance characteristics in data write/erase operations are good. However, the memory has the problem that if the rewrite current value is set to a low current equal to or less than 100 μA, the data maintenance characteristics deteriorate. Also, due to insufficient characteristics during erase operation, a high voltage is necessary in erasing data. Further, since the resistance value in an erase state tends to change toward a lower value with respect to multiple write/erase operations, the resistance separation width of write resistance and erase resistance becomes insufficient.

In view of the above situation, it is desirable to provide a memory component and a memory device, which can improve the maintenance characteristics of written data at low current and can lower a voltage necessary for an erase operation. It is also desirable to provide a memory component and a memory device, which can reduce the difference between resistance values in an erase state with respect to multiple write/erase operations.

According to an embodiment of the present invention, there is provided a memory component, which includes a first electrode, a memory layer, and a second electrode in this order; wherein the memory layer includes a high resistance layer which includes tellurium (Te) as the chief component among anion components and is formed on the first electrode side; and an ion source layer which includes at least one kind of metal element and at least one kind of chalcogen element among tellurium (Te), sulfur (S) and selenium (Se) and is formed on the second electrode side.

According to another embodiment of the present invention, there is provided a memory device, which includes a plurality of memory components each of which has a first electrode, a memory layer, and a second electrode in this order; and a pulse applying means for selectively applying voltage or current pulses to the plurality of memory components; wherein the memory component according to the embodiment of the present invention is used as the memory component.

According to still another embodiment of the present invention, there is provided a memory component, which includes a first electrode, a memory layer, and a second electrode in this order; wherein the memory layer includes a high resistance layer which is formed on the first electrode side and includes a plurality of layers, wherein at least one of the plurality of layers includes tellurium (Te) as the chief component among anion components; and an ion source layer which includes at least a kind of metal element and at least a kind of chalcogen element among tellurium (Te), sulfur (S) and selenium (Se) and is formed on the second electrode side.

According to yet another embodiment of the present invention, there is provided a memory device, which includes a plurality of memory components each of which has a first electrode, a memory layer, and a second electrode in this order; and a pulse applying means for selectively applying voltage or current pulses to the plurality of memory components; wherein the memory component according to the still another embodiment of the present invention is used as the memory component.

In the memory component (memory device) according to the embodiment of the present invention, if a voltage or current pulse of a "positive direction" (for example, a negative electric potential on the first electrode side and a positive electric potential on the second electrode side) is applied to the memory component in an initial state (high resistance state), a metal element included in an ion source layer is ionized and diffused into the inside of the high resistance layer, and the diffused metal element is bonded with electrons on the first electrode to be extracted or remains inside the high resistance layer to form an impurity level. Accordingly, a conduction path that includes the metal element is formed inside the memory layer, and the resistance of the high resistance layer is lowered (write state). If a voltage pulse of a "negative direction" (for example, a positive electric potential on the first electrode side and a negative electric potential on the second electrode side) is applied to the memory component in this low-resistance state and the metal element being extracted on the first electrode is ionized and dissolved into the inside of the ion source layer. Accordingly, the conduction path that includes the metal element vanishes, and the resistance of the high resistance layer is heightened (initial state or erase state).

Here, since the high resistance layer includes the layer that includes tellurium (Te) as the chief component among anion components, the metal element that has been diffused into the high resistance layer during the low-resistance state of the high resistance layer is stabilized to facilitate the maintenance in the low-resistance state. On the other hand, since tellurium (Te) has a weak bonding force with the metal element in comparison to an oxide or a silicon compound and the metal element which has been diffused into the inside of the high resistance layer is liable to move to the ion source layer, the erase characteristics are improved.

According to the memory component or memory device according to an embodiment of the present invention, since the high resistance layer in the memory layer includes a layer that includes tellurium (Te) as the chief component among anion components, the maintenance characteristics of the written data in a low-resistance state can be improved, and the low-voltage operation can be realized during the data erase. Further, it is possible to reduce the difference between the resistance values in the erase state with respect to multiple write/erase operations.

BRIEF DESCRIPTION OF THE DRAWINGS

FIGS. 7A to 7C are diagrams illustrating the erase characteristic and the data maintenance characteristic in the same manner;

FIGS. 8A to 8C are diagrams illustrating the data maintenance characteristic of a memory component according to experiment 2;

FIGS. 9A to 9C are diagrams illustrating the erase characteristic of a memory component according to experiment 2;

FIGS. 11A to 11D are diagrams illustrating the erase characteristic and the data maintenance characteristic of a memory component according to experiment 3.

DESCRIPTION OF THE PREFERRED EMBODIMENTS

Hereinafter, embodiments of the present invention will be described in the following order with reference to the drawings.

First Embodiment (1) Memory component (memory component having a single-layer high resistance layer)
(2) Memory device Second Embodiment (1) Memory component (Memory component having two-layer high resistance layer)

EXAMPLE

First Embodiment

Memory Component

Figure 1:
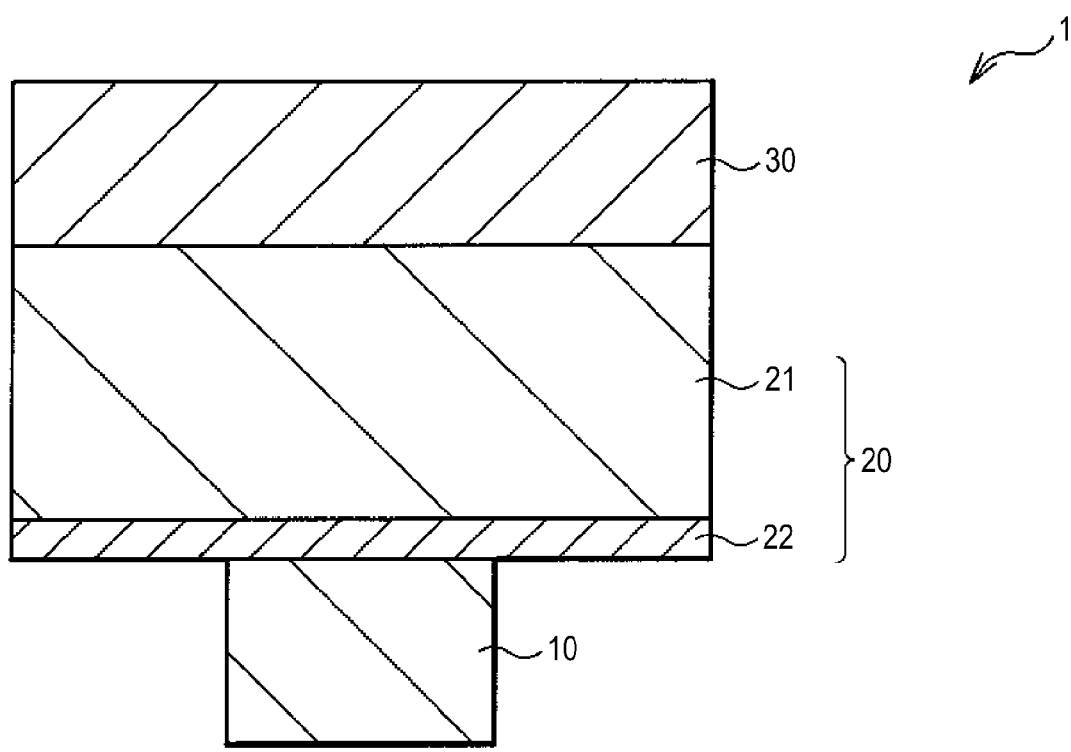
FIG. 1 is a cross-sectional view illustrating the configuration of a memory component according to a first embodiment of the present invention.

FIG. 1 is a cross-sectional view illustrating the configuration of a memory component 1 according to a first embodiment of the present invention. This memory component 1 includes a lower electrode (first electrode) 10, a memory layer 20, and an upper electrode (second electrode) 30 in this order.

The lower electrode 10, for example, as described later (FIG. 2), is formed on a silicon substrate 41 on which a CMOS (Complementary Metal Oxide Semiconductor) circuit is formed, and serves as a connection portion to the CMOS circuit portion. This lower electrode 10 is configured by an interconnection material used for a semiconductor process, for example, W (Tungsten), WN (Tungsten Nitride), Cu (Copper), Al (Aluminum), Mo (Molybdenum), Ta (Tantalum), silicide, or the like. In the case where the lower electrode 10 is made of a material such as copper (Cu) that has a possibility that ion conduction occurs in an electric field, the surface of the lower electrode 10 that is made of copper (Cu) or the like may be coated with a material that is difficult to achieve ion conduction or thermal diffusion, such as W (Tungsten), WN (Tungsten Nitride), TiN (Titanium Nitride), TaN (Tantalum Nitride), or the like. Also, in the case where Al (Aluminum) is included in an ion source layer 21 to be described later, it is preferable to use a material that is more difficult to be ionized than Al (Aluminum), for example, a metal film that includes at least one kind of Cr (Chrome), W (Tungsten), Co (Cobalt), Si (Silicon), Au (gold), Pd (Palladium), Mo (Molybdenum), Ir (Iridium), Ti (Titanium), and the like, or their oxide film or nitride film.

The memory layer 20 is composed of an ion source layer 21 and a high resistance layer 22. The ion source layer 21 includes for example, one kind, or two or more kinds of metal element such as copper (Cu), silver (Ag), Zinc (Zn), and the like, as a positively ionizable element. The memory layer 20 also includes one kind, or two or more kinds of chalcogen element among tellurium (Te), sulfur (S), and Selenium (Se), as a negatively ionizable ion conduction material and is formed on the side of the upper electrode 30, and here, is formed in contact with the upper electrode 30.

The metal element and the chalcogen element are combined with each other to form a metal chalcogenide layer. This metal chalcogenide layer mainly has an amorphous structure, and serves as an ion supply source. The ion source layer 21 has resistance that is lower than that of the high resistance layer 22 in an initial state or an erase state.

Since a positively ionizable metal element is deoxidized on a cathode electrode during a write operation to form a conduction path (filament) in a metal state, it is preferable that such a metal element is a chemically stable element which can exists in a metal state in the inside of the ion source layer 21 that includes the chalcogen element. For example, such a metal element may be a transition metal in groups 4A, 5A, and 6A in a periodic table such as Ti (Titanium), Zr (Zirconium), Hf (Hafnium), V (Vanadium), Nb (Niobium), Ta (Tantalum), Cr (Chrome), Mo (Molybdenum), and W (Tungsten). Among these elements, one kind or two or more kinds thereof may be used. In addition, Al (Aluminum), Cu (Copper), Ge (Germanium), or Si (Silicon) or the like may be used as an additive element of the ion source layer 21.

Also, if the ion source layer 21 is made to have a laminated structure which is called a Te/ion source layer (including a metal element M) using the metal element (M) that is liable to react on the tellurium (Te) included in the high resistance layer 22 to be described layer, an element that is liable to react on the tellurium (Te) which is stabilized as a structure that is called an MTe/ion source layer 21 may be aluminum (Al) or magnesium (Mg) by heat treatment after the film forming.

The detailed material of the ion source layer 21 as described above may be, for example, ZrTeAl, TiTeAl, CrTeAl, WTeAl, or TaTeAl. Also, for example, as ZrTeAl, CuZrTeAl that is obtained by adding Cu to ZrTeAl, CuZrTeAlGe that is obtained by adding Ge to CuZrTeAl, or CuZrTeAlSiGe that is obtained by adding an additive element to CuZrTeAlGe may be used. Also, ZrTeMg that is obtained by using Mg instead of Al in ZrTeAl may be used. As a metal element for ionization, even in the case where a different transition metal element such as titanium (Ti) or tantalum (Ta) is selected instead of zirconium (Zr), it is also possible to use the same additive element, for example, TaTeAlGe or the like is also possible. Further, as an ion conduction material, sulfur (S), selenium (Se), or Iodine (I) may be used in addition to tellurium (Te), and specifically, ZrSAl, ZrSeAl, or ZeIAl or the like may be used.

In this case, for the purpose of suppressing the film peeling-off during high-temperature heat treatment in the memory layer 20, other elements may be added to the ion source layer 21. For example, silicon (Si) is an additive element from which the improvement of the maintenance characteristic can also be expected, and it is preferable to add the silicon (Si) together with zirconium (Zr) to the ion source layer 21. However, if the additive amount of silicon (Si) is too small, the film peeling-off prevention effect is unable to be expected, while if the additive amount is too large, it becomes difficult to obtain a good memory operation characteristic. It is preferable that the content of silicon (Si) in the ion source layer 21 is in the range of about 10 to 45 atom %.

The high resistance layer 22 is on the side of the lower electrode 10, and here, is formed in contact with the lower electrode 10. This high resistance layer 22 has a function as a barrier to the electric conduction, and in the case where a predetermine voltage is applied between the lower electrode 10 and the upper electrode 30, the high resistance layer 22 indicates a resistance value that is higher than that of the ion source layer 21. In this embodiment, the high resistance layer 22 is composed of a compound having tellurium (Te) that behaves as an anion component as a main component. Such a compound may be, for example, AlTe, MgTe, or ZnTe. As the composition of a compound that contains tellurium (Te), for example, it is preferable that the content of the aluminum (Al) in AlTe is equal to or more than 20 atom % and equal to or less than 60 atom % due to the reason to be described later. Also, it is preferable that the initial resistance value of the high resistance layer 22 is equal to or more than 1MΩ. From this, it is preferable that the resistance value in a low-resistance state is equal to or less than several hundreds of kΩ. In order to read the resistance state of a miniaturized resistance change type memory at high speed, it is preferable to lower the resistance value in the low resistance state as low as possible. However, since the resistance value that is written on the conditions of 20 to 50 µA and 2V is 40 to 100 kΩ, it is assumed that the initial resistance value of the memory is higher than this value. Further, in consideration of the resistance separation width of one digit, the resistance value is considered to be appropriate.

Although the upper electrode 30 is formed using a known semiconductor interconnection material in the same manner as the lower electrode 10, it is preferable to use a stable material that does not react on the ion source layer 21 even through a post-annealing process.

In the memory component 1 according to this embodiment, if a voltage pulse or a current pulse is applied from a power supply (pulse applying unit) (not illustrated) through the lower electrode 10 and the upper electrode 30, the electrical characteristic (resistance value) of the memory layer 20 is changed, and thus write, erase, and read of information are performed. Hereinafter, the operation will be described in detail.

First, by making the upper electrode 30 at a positive electric potential and the lower electrode 10 at a negative electric potential, a positive voltage is applied to a memory component 1. Accordingly, a metal element included in the ion source layer 21 is ionized and diffused into the high resistance layer 22, and the diffused metal element is bonded with electrons on the side of the lower electrode 10 to be extracted. As a result, a conduction path (filament) of the low-resistance metal element, which has been deoxidized into the metal state, is formed on an interface between the lower electrode 10 and the memory layer 20. On the other hand, the ionized metal element remains inside the high resistance layer 22 to form an impurity level. Accordingly, the conduction path is formed inside the high resistance layer 22 to lower the resistance value of the memory layer 20, and thus the high resistance layer 22 is changed from a high resistance state that is the initial state to a low resistance state. Thus, the high resistance layer is also called a variable resistance layer.

Thereafter, even if the voltage applied to the memory component 1 is removed by removing the positive voltage, the low resistance state is maintained. Accordingly, information is written. In the case of using an only once writable memory device, so called a PROM (Programmable Read Only Memory), the writing is completed only by the above-described writing process. On the other hand, although an erase process is necessary in the application to an erasable memory device, that is, a RAM (Random Access Memory) or an EEPROM (Electrically Erasable and Programmable Read Only Memory), a negative voltage is applied to the memory component 1 so that the upper electrode 30 is at a negative electric potential and the lower electrode 10 is at a positive electric potential in the erase process. Accordingly, the metal element of the conduction path that has been formed in the memory layer 20 is ionized to be dissolved into the ion source layer 21 or is bonded with tellurium (Te) or the like to form a compound such as Cu2Te, CuTe, or the like. Accordingly, the conduction path due to the metal element is vanished or reduced to heighten the resistance value. Also, in the case of applying a high voltage, the additive element, such as aluminum (Al) or Germanium (Ge), which exists inside the ion source layer 21, forms an oxide film or a nitride film on the first electrode, and the memory layer 20 is changed to a higher resistance state.

Thereafter, even if the voltage applied to the memory component 1 is removed by removing the negative voltage, the higher resistance state is maintained. Accordingly, it becomes possible to erase the written information. By repeating the above-described processes, the write of information in the memory component 1 and the erase of the written information can be repeatedly performed.

For example, by making the high resistance value state correspond to information "0" and making the low resistance value state correspond to information "1", respectively, the information can be changed from "0" to "1" in the process of writing the information through application of the positive voltage, and the information can be changed from "1" to "0" in the process of erasing the information through application of the negative voltage. Here, it is exemplified that the operation of making the memory component in a low resistance state and the operation of making the memory component in a high resistance state correspond to the write operation and the erase operation, respectively. However, the corresponding relationship may be defined to the contrary.

In order to demodulate the written data, it is preferable that the ratio of the resistance value after writing to the initial resistance value becomes greater. However, if the resistance value of the high resistance layer is too large, it is difficult to write, that is, to make the memory component in a low resistance state, and the write threshold voltage becomes too large. Accordingly, the initial resistance value is adjusted to be equal to or less than 1 GΩ. The resistance value of the high resistance layer 22 can be controlled, for example, by the thickness of the high resistance layer 22 or the amount of anions included in the high resistance layer.

In this embodiment, since the high resistance layer 22 is formed by a compound having tellurium (Te) as a main component, the metal element diffused from the ion source layer 21 during the low resistance state of the high resistance layer 22 is stabilized inside the high resistance layer 22, and thus it becomes easy to maintain the low resistance state. Also, since tellurium (Te) has a weak bonding force with the metal element in comparison to an oxide having a high electronegativity or a silicon compound that has a covalent bond, and the metal element which has been diffused into the inside of the high resistance layer 22 is liable to move to the ion source layer 21 by the applying of the erase voltage, the erase characteristic is improved. Also, in the chalcogenide compound, the absolute values of the electronegativity are heightened in the order of tellurium<selenium<sulfur<oxygen, the improvement effect may be heightened as oxygen in the high resistance layer 22 becomes smaller or the chalcogenide having a low electronegativity is used.

Further, in this embodiment, as described above, it is preferable that the ion source layer 21 includes zirconium (Zr), aluminum (Al), germanium (Ge), and the like. Hereinafter, the reason will be described.

In the case where zirconium (Zr) is included in the ion source layer 21, zirconium (Zr), together with the metal element such as copper (Cu) and the like, acts as an ionization element, and a conduction path, in which zirconium (Zr) and the above-described metal element such as copper (Cu) are mixed, is formed. It is considered that zirconium (Zr) is deoxidized on a cathode electrode during a write operation, and forms a filament in a metal state in a low resistance state after the write operation. The metal filament in which zirconium (Zr) is deoxidized is relatively difficult to be dissolved in the ion source layer 21 that includes a chalcogen element such as sulfur (S), selenium (Se), and tellurium (Te), and in a once-write state, that is, in a lower resistance state, it is easy to maintain the low resistance state in comparison to the above-described conduction path of a single metal element such as copper (Cu). For example, copper (Cu) is formed as a metal filament by the write operation. However, copper (Cu) in a metal state is easily dissolved in the ion source layer 21 including chalcogen element so that it is ionized again and shifted to a high resistance state in a state where a write voltage pulse is not applied (data maintenance state). Due to this, sufficient date maintenance function is not obtained. On the other hand, since the mixing of zirconium (Zr) with a proper amount of copper (Cu) accelerates the amorphization and uniformly maintains a miniaturized structure of the ion source layer 21 to contribute to the improvement of a resistance value maintenance performance.

Also, in maintaining the high resistance state during the erase operation, in the case where zirconium (Zr) is included in the ion source layer 21, for example, a conduction path of zirconium (Zr) is formed, and in the case where zirconium (Zr) is dissolved as ions in the ion source layer 21 again, zirconium (Zr) is difficult to move even though the temperature is heightened or the zirconium (Zr) is left for a long time as it is since zirconium (Zr) has a lower ion mobility than copper (Cu). Due to this, it is difficult that the extraction occurs in a metal state on the cathode electrode, and even in the case where a high temperature state that is higher than the ambient temperature is maintained or the state is maintained for a long time, the high resistance state is maintained.

Further, in the case where aluminum (Al) is included in the ion source layer 21, if the upper electrode is biased to a negative electric potential by the erase operation, a stable oxide film is formed on the interface between the ion source layer 21, which acts like solid electrolyte, and an anode electrode, and thus the high resistance state (erase state) is stabilized. In addition, from the viewpoint of self-regeneration of the high resistance layer, it also contributes to the increase of the number of repetitions. In this case, in addition to aluminum (Al), germanium (Ge) or the like, which performs the same action, may be included.

As described above, in the case where the ion source layer 21 includes zirconium (Zr), aluminum (Al), germanium (Ge), and the like, a wide-range resistance value maintenance performance and a high-speed write/erase operation performance are improved in comparison to the memory component in the related art, and the number of repetitions is also increased. Further, for example, if an intermediate state between the high resistance state and the low resistance state is made by adjusting the erase voltage when the resistance state is changed from the low resistance state to the high resistance state, the state can be stably maintained. Accordingly, it is possible to realize a multi-value memory in addition to a two-value memory. In this case, the intermediate state can also be generated by adjusting the amount of atoms being extracted through the change of write current when the resistance state is changed from the high resistance state to the lower resistance state.

However, the important characteristics of memory operations, such as the write/erase operation characteristic for applying such a voltage, the resistance value maintenance characteristic, and the number of repetitions of operation, may differ according to the additive amount of zirconium (Zr), copper (Cu), aluminum (Al), and germanium (Ge).

For example, if the content of zirconium (Zr) is too high, the resistance value of the ion source layer 21 is excessively lowered, and it may not be possible to apply an effective voltage to the ion source layer 21 or it is difficult to dissolve zirconium (Zr) in the chalcogenide layer. Due to this, especially the erase becomes difficult, and the erase threshold voltage is increased according to the additive amount of zirconium (Zr). If the erase threshold voltage becomes too high, it becomes difficult to write, that is, to be in the low resistance state. On the other hand, if the additive amount of zirconium (Zr) is too small, the effect of improving the above-described wide-range resistance value maintenance characteristic is reduced. Accordingly, the content of zirconium (Zr) in the ion source layer 21 is preferably 7.5 or more, and more preferably 26 atom % or less.

Also, in the case where a proper amount of copper (Cu) is added to the ion source layer 21, the amorphization is accelerated, whereas in the case where the amount of cupper (Cu)

is too large, copper (Cu) in a metal state has insufficient stability in the ion source layer 21 that includes the chalcogen element, and thus the write maintenance characteristic becomes worse or a bad influence is exerted on the high speed write operation. On the other hand, the mixing of zirconium (Zr) with copper (Cu) facilitates the amorphous forming, and thus uniformly maintains a miniaturized structure of the ion source layer 21. Accordingly, since the non-uniformity of material components in the ion source layer 21 due to repeated operations is prevented, the number of repetitions is increased and the maintenance characteristics are improved. In the case where a sufficient amount of zirconium (Zr) is contained within the above-described range, even if the conduction path of copper (Cu) is re-dissolved in the ion source layer 21, it is considered that the conduction path by the metal zirconium (Zr) remains, and thus the influence on the write maintenance characteristics does not appear. Also, it is sufficient if an equivalent relationship of charge quantities of cations and anions in a dissociated and ionized state is kept, and according to a desirable additive amount of copper (Cu), the equivalent ratio of charges of ions is within the range as below.

{(maximum ion valence of Zr×the number of moles or atom %)+(ion valence of Cu×the number of moles or atom %)}(ion valence of chalcogen element×the number of moles or atom %)=0.5 to 1.5

However, the characteristic of the memory component 1 depends upon the composition ratio of zirconium (Zr) to tellurium (Te). Accordingly, it is preferable that the composition ratio of zirconium (Zr) to tellurium (Te) is within the range as below.

Zr composition ratio (atom %)/Te composition ratio (atom %)=0.2 to 0.74

For this, although it is not necessarily accurate, this is caused by the fact that only in the case where the composition ratio is within the above-described range a desirable resistance value is obtained on the point that the degree of disparity of copper (Cu) is lower than that of zirconium (Zr) and the resistance value of the ion source layer 21 is determined by the composition ratio of zirconium (Zr) and tellurium (Te), and the bias voltage applied to the memory component 1 is effectively applied to the portion of the high resistance layer 22.

If the composition ratio gets out of the above-described range, for example, if the equivalent ratio is too high, the balance of the cations and the anions is unable to be obtained, and the amount of unionized element among the existing metal elements is increased. Due to this, it is considered that it is difficult to efficiently remove the conduction path occurred in the write operation during the erase operation. In the same manner, if the equivalent ratio is too low and the anion elements exist excessively, it becomes difficult that the conduction path in a metal state occurred in the write operation exists in a metal state, and thus the maintenance performance of the write state deteriorates.

Also, if the content of aluminum (Al) is too high, the aluminum (Al) ions move easily, and the write state is made by the deoxidization of the aluminum (Al) ions. Since aluminum (Al) has a low stability in a metal state inside a solid electrolyte of chalcogenite, the maintenance performance of the low resistance write state deteriorates. On the other hand, if the amount of aluminum (Al) is excessively small, the erase operation itself or the effect of improving the maintenance characteristic of the high resistance region is lowered, and the number of repetitions is reduced. Accordingly, the content of aluminum (Al) inside the ion source layer 21 is preferably equal to or more than 30 atom %, and more preferably equal to or less 50 atom %.

Germanium (Ge) is not necessarily included, and if the content of germanium (Ge) is too high, the write maintenance characteristics deteriorate, and thus the content of germanium (Ge) in the case of adding germanium (Ge) is preferably equal to or less than 15 atom %.

Hereinafter, a method of manufacturing a memory component 10 according to this embodiment will be described.

First, on the substrate on which a CMOS circuit such as a selection transistor is formed, for example, a lower electrode 10 made of tungsten (W) is formed. Thereafter, if necessary, an oxide or the like is removed from the surface of the lower electrode 10 by reverse sputtering or the like. Then, by exchanging respective targets in a sputtering device using the targets made of composition that adapts materials of the high resistance layer 22, the ion source layer 21, and the upper electrode 30, the respective layers are successively formed. The diameter of the electrode is 50 to 300 nmϕ. The alloy films are simultaneously formed using the targets of the constituent elements.

After the film forming up to the upper electrode 30, an interconnection layer (not illustrated) that connects to the upper electrode 30 is formed, and a contact portion for obtaining a common electric potential with all memory components 1 is connected thereto. Thereafter, a post-annealing process is performed with respect to the laminated film. Through the above-described processes, the memory component 1 as illustrated in FIG. 1 is completed.

As described above, according to the memory component 1 according to this embodiment, since the high resistance layer 22 having tellurium (Te) as its main component is formed, the metal element which has been diffused from the ion source layer 21 during the low resistance state of the high resistance layer 22 is stabilized inside the high resistance layer 22, and thus it becomes possible to improve the low resistance state, that is, the write maintenance characteristics. On the other hand, since tellurium (Te) has a weak bonding force with the metal element in comparison to an oxide having a high electronegativity or a silicon compound that has a covalent bond, the metal element which has been diffused into the inside of the high resistance layer 22 is liable to move to the ion source layer 21, and thus it becomes possible to lower the voltage that is necessary during the erase operation, that is, in a high resistance state. Also, the difference between resistance values in an erase state with respect to multiple write/erase operations can be reduced. Particularly, in this embodiment, since tellurium (Te), which has the lowest electronegativity in the chalcogenite, is used, the improvement effect of the write maintenance characteristic is heightened.

Also, since the ion source layer 21 includes zirconium (Zr), aluminum (Al), germanium (Ge), and the like, data maintenance characteristics are superior. Also, in the case of miniaturization, information can be maintained even in the case where the current driving force of the transistor is decreased. Accordingly, by configuring the memory device using this memory component 1, high density and miniaturization can be sought.

[Memory Device]

A memory device (memory) can be configured by arranging a plurality of memory components 1, for example, in the form of a column or in the form of a matrix. In this case, a memory cell is configured by connecting, if necessary, a MOS transistor for selecting an element or a diode to each memory component 1, and a sense amplifier, an address decoder, a write/erase/read circuit, and the like, may be connected to memory cells through interconnections.

Figure 2:
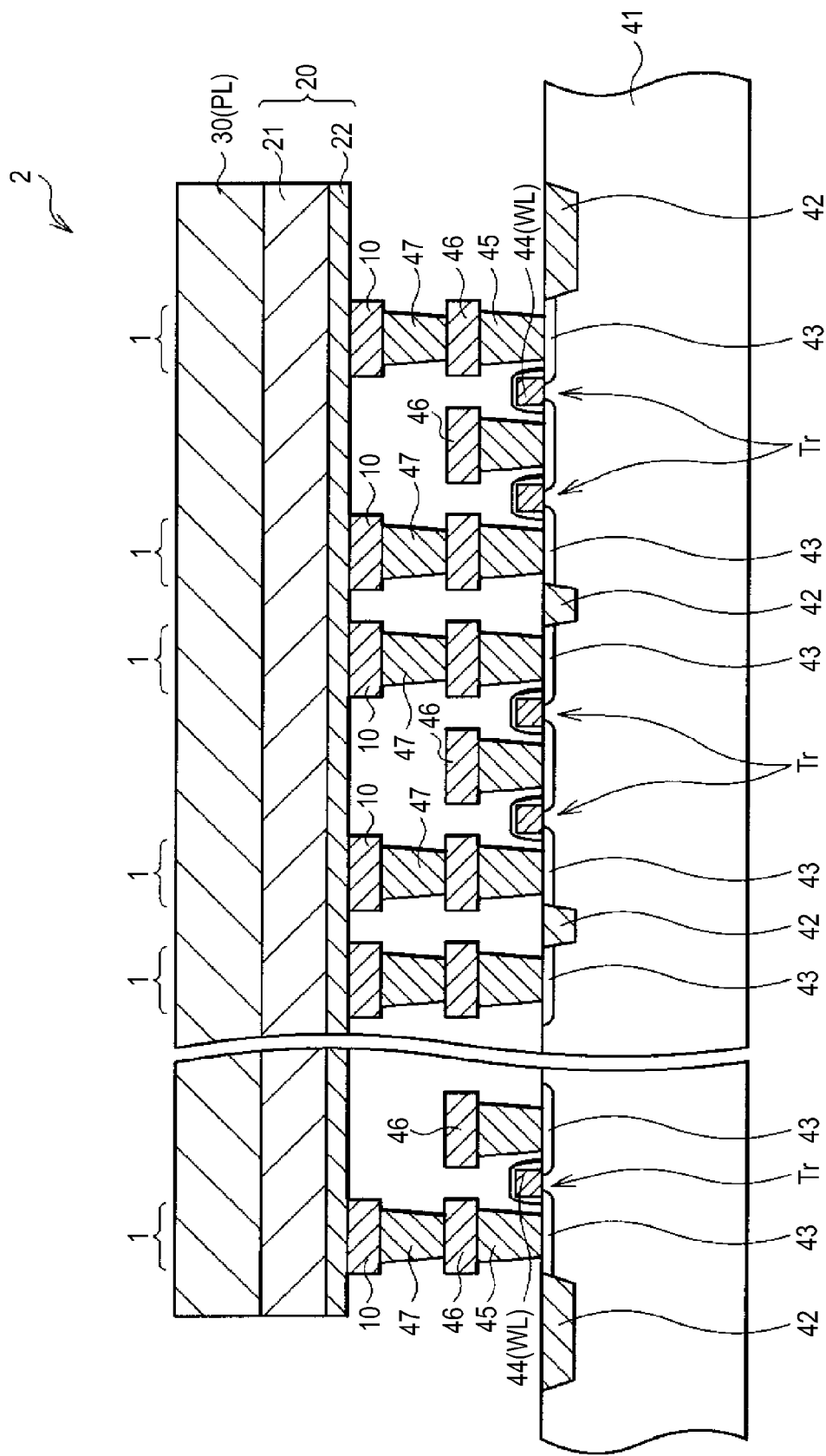
FIG. 2 is a cross-sectional view illustrating the configuration of a memory cell array that uses the memory component of FIG. 1.
Figure 3:
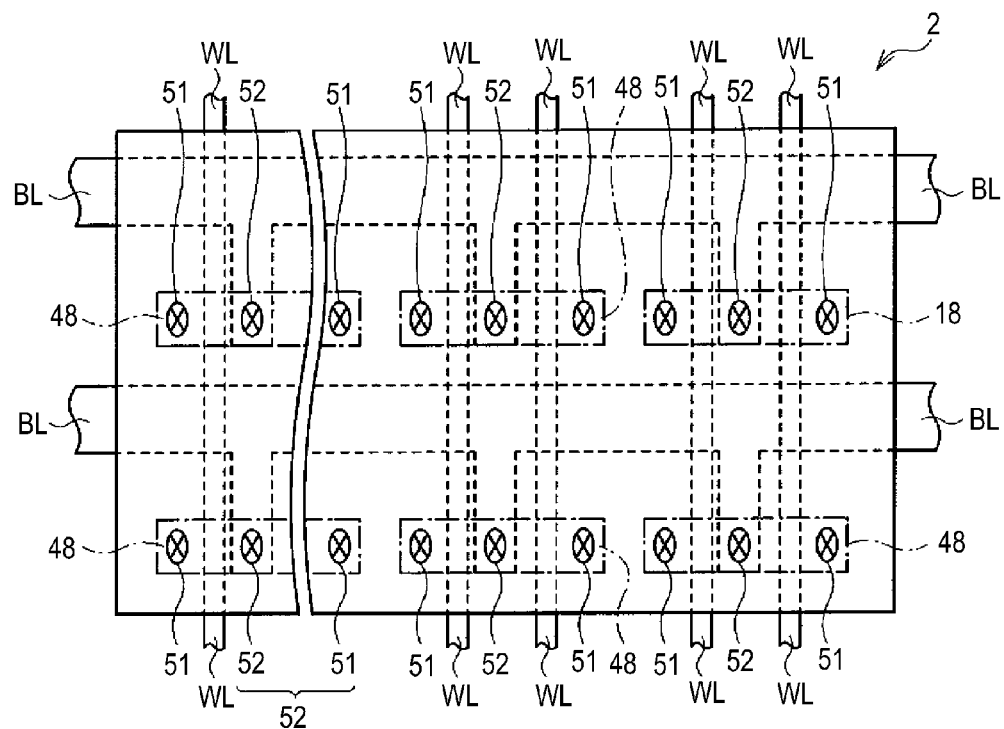
FIG. 3 is a plan view of a memory cell array in the same manner.

FIGS. 2 and 3 illustrate an example of a memory device (memory cell array 2) in which a plurality of memory components 1 are arranged in the form of a matrix. FIG. 2 is a cross-sectional view, and FIG. 3 is a plan view illustrating the configuration of the memory cell array 2. In the memory cell array 2, with respect to each memory component 1, an interconnection that is connected to the side of its lower electrode 10 and an interconnection that is connected to the side of its upper electrode 30 are formed so as to cross each other, and in the neighborhood of a cross point of these interconnections, for example, each memory component 1 is arranged.

All the memory components 1 share each layer of the high resistance layer 22, the ion source layer 21, and the upper electrode 30. That is, the high resistance layer 22, the ion source layer 21, and the upper electrode 30, respectively, are configured by respective common layers (same layers) for all the memory components 1. The upper electrode 30 is a common plate electrode PL with respect to neighboring cells.

On the other hand, the lower electrode 10, which is separately formed for each memory cell, is electrically separated between neighboring cells, and a memory component 1 of each memory cell is prescribed in a position that corresponds to the lower electrode 10. The lower electrode 10 is connected to a corresponding MOS transistor Tr for selecting a cell, and each memory component 1 is formed on the upper side of the MOS transistor Tr.

The MOS transistor Tr is composed of source/drain regions 43 that are formed in regions separated by an element isolation layer 42 in the semiconductor substrate 41 and a gate electrode 44. On the wall surface of the gate electrode 44, a side wall insulating layer is formed. The gate electrode 44 also serves as a word line WL which is a one-side address line of the memory component 1. One side of the source/drain regions 43 of the MOS transistor Tr and the lower electrode 10 of the memory component 1 are electrically connected to each other via a plug layer 45, a metal interconnection layer 46, and a plug layer 47. The other side of the source/drain regions 43 of the MOS transistor Tr is connected to the metal interconnection layer 46 via the plug layer 45. The metal interconnection layer 46 is connected to a bit line BL (see FIG. 3) that is the other address line of the memory component 1. In this case, as illustrated in FIG. 3, an active region 48 of the MOS transistor Tr is indicated by a dashed line, and a contact portion 51 is connected to the lower electrode 10 of the memory component 1 and a contact portion 52 is connected to the bit line BL.

In this memory cell array 2, the gate of the MOS transistor Tr is in an on state by the word line WL, and if a voltage is applied to the bit line BL, the voltage is applied to the lower electrode 10 of the selected memory cell through the source/drain of the MOS transistor Tr. Here, if the polarity of the voltage applied to the lower electrode 10 is a negative electric potential in comparison to the electric potential of the upper electrode 30 (plate electrode PL), the resistance value of the memory component 1 is shifted to a low resistance state as described above. As a result, the information was written in the selected memory cell. In addition, the voltage of a positive electric potential was applied to the lower electrode 10 in comparison to the electric potential of the upper electrode 30 (the plate electrode PL), the resistance value of the memory component 1 is shifted to a high resistance state again. Accordingly, information written in the selected memory cell is erased. In order to read the written information, for example, a memory cell is selected by a MOS transistor Tr, and a predetermined voltage or current is applied to the cell.

The current or voltage, which differs according to the resistance state of the memory component 1, is detected through a sense amplifier connected to the bit line BL or the plate electrode PL. At this time, the voltage or current applied to the selected memory cell is set to be smaller than a threshold value such as a voltage by which the resistance value state of the memory component 1 is shifted.

The memory device according to this embodiment can be applied to various kinds of memory devices as described above. For example, the memory device according to this embodiment can be applied to any type of memory, such as an only once writable PROM, an electrically erasable EEPROM, a RAM in which high speed write/erase/read operations are possible.

Second Embodiment

Figure 4:
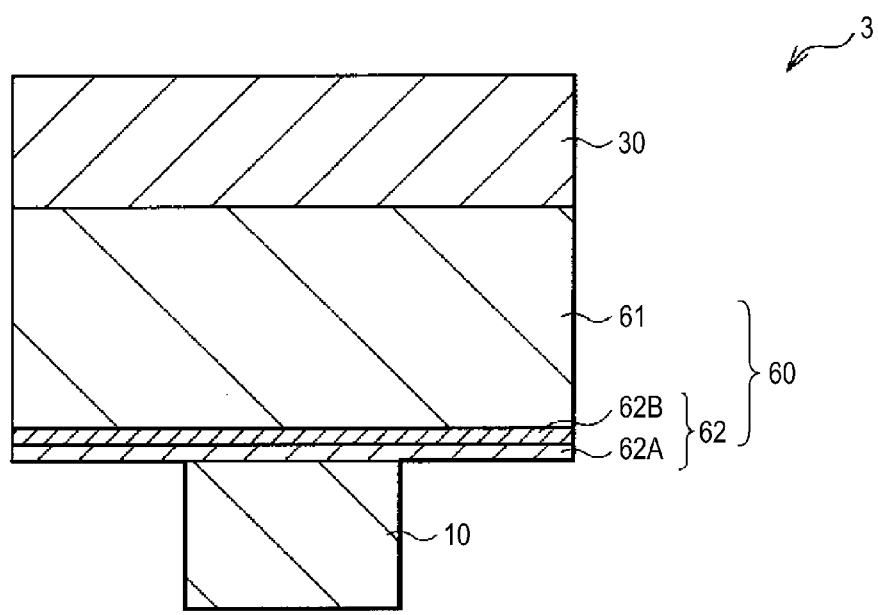
FIG. 4 is a cross-sectional view illustrating the configuration of a memory component according to a second embodiment of the present invention.
Figure 5A:
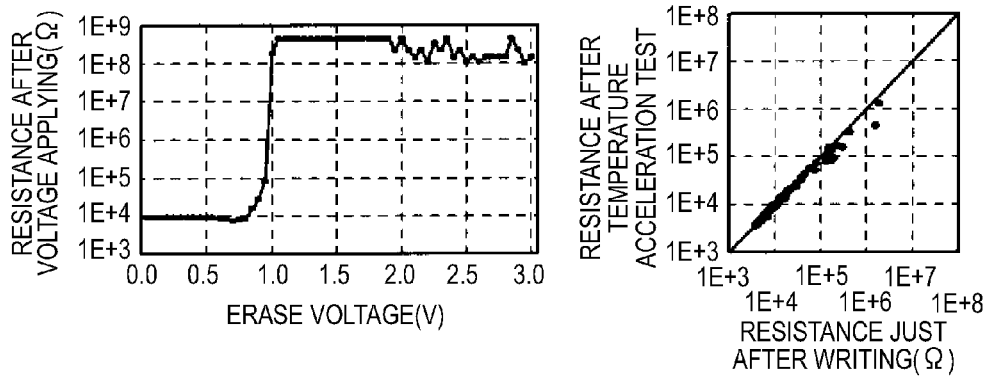
FIGS. 5A to 5C are diagrams illustrating the erase characteristic and the data maintenance characteristic of a memory component according to experiment 1.
Figure 5B:
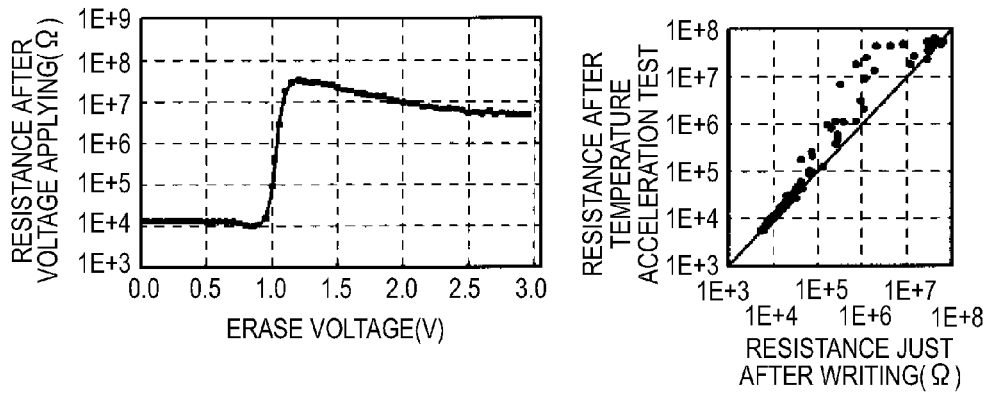
Figure 5C:
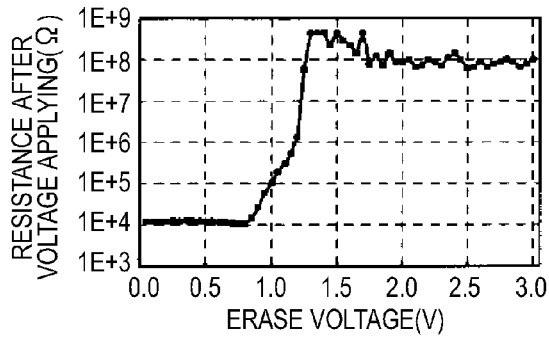
Figure 6A:
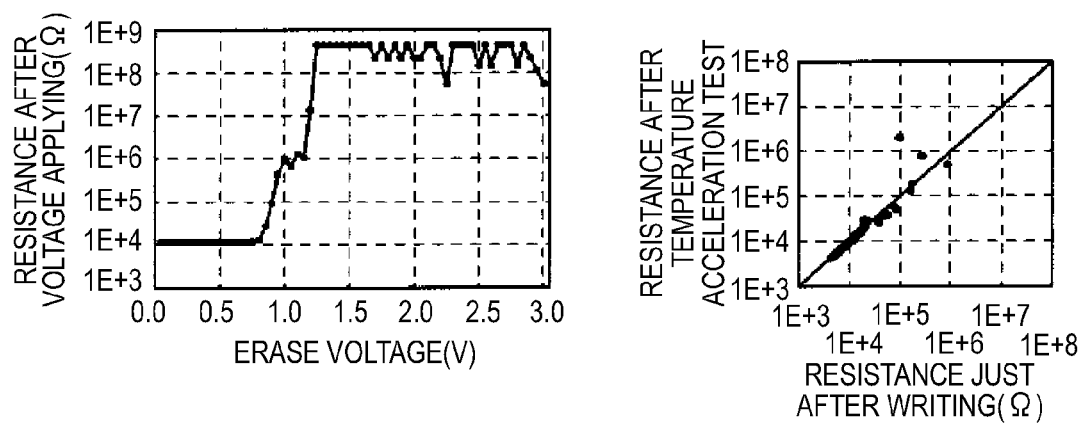
FIGS. 6A and 6B are diagrams illustrating the erase characteristic and the data maintenance characteristic in the same manner.
Figure 6B:
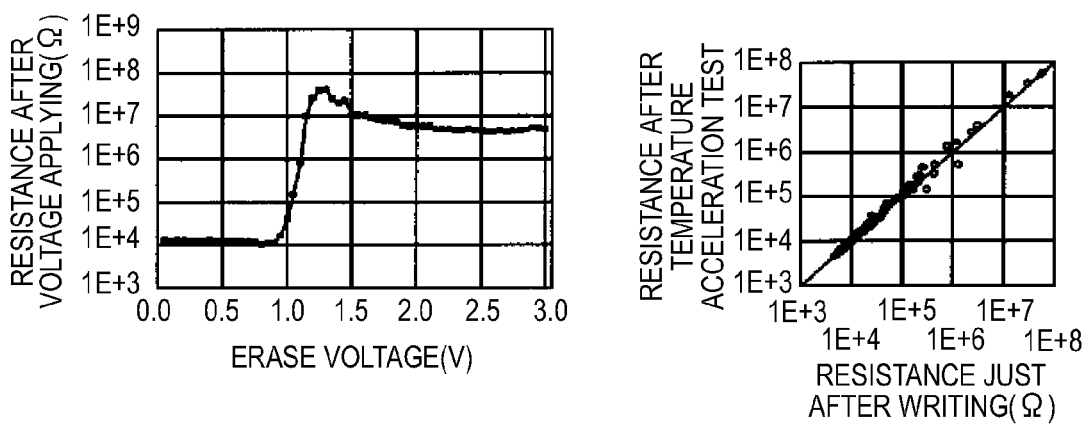

FIG. 4 is a cross-sectional view illustrating the configuration of a memory component 3 according to a second embodiment of the present invention. Hereinafter, although other embodiments will be described, the same reference numerals are given to the same configuration portions as those according to the first embodiment, and the explanation thereof will be omitted. The memory component 3 includes a lower electrode (first electrode) 10, a memory layer 60, and an upper electrode (second electrode) 30 in this order.

The memory layer 60 includes anion source layer 61 that has the same composition as the ion source layer 21, and a high resistance layer 62. In this embodiment, the high resistance layer 62 has a double-layer structure of plural layers, for example, a first high resistance layer 62A and a second high resistance layer 62B. The first high resistance layer 62A and the second high resistance layer 62B function as barriers to the electric conduction, and have resistance values that are higher than that of the ion source layer 61 and different compositions.

The first high resistance layer 62A, for example, is composed of a compound having tellurium (Te) that behaves as an anion component as a main component, and is on the side of the lower electrode 10, and here, is in contact with the lower electrode 10. The compound having tellurium (Te) as the main component may be, for example, an Al—Te compound, a Mg—Te compound, or a Zn—Te compound. Since the resistance value of the high resistance layer 62 is the sum of the resistance values of the first high resistance layer 62A and the second high resistance layer 62B, by the above-described reason, the resistance value of the first high resistance layer 62A may be about 40 kΩ or more. From this, the composition of the compounds that contain tellurium (Te), for example, the content of aluminum (Al) in the Al—Te compound may be equal to or more than 0 atom % and equal to or less than 70 atom %. More preferably, the content of the aluminum (Al) is equal to or more than 20 atom % and equal to or less than 60 atom %.

The second high resistance layer 62B, for example, is composed of a compound that includes an element, such as oxygen (O), nitride (N), or carbon (C), except for tellurium (Te), as an anion component, and is on the side of the ion source layer 61, and here, is in contact with the ion source layer 61. Such a compound may be, for example, gadolinium oxide (GdOx).

It is preferable that the high resistance layer 62 has a resistance value equal to or more than 1MΩ as the sum of the resistance values of the first high resistance layer 62A and the second high resistance layer 62B. In this case, it is sufficient if the high resistance layer 62 has at least one layer of the high resistance layer having tellurium (Te) as its main component, and the position of the high resistance layer having tellurium (Te) as the main component is not particularly considered. That is, in this embodiment, the first high resistance layer 62A having tellurium (Te) as the main component is in contact with the lower electrode 10, and the second high resistance layer 62B that is composed of a compound including an anion component except for tellurium (Te) is in contact with the ion source layer 61, and vice versa.

The operation and effect of the memory component 3 according to this embodiment are the same as those of the memory component 1 according to the first embodiment, but since the high resistance layer 62 has a double-layer structure, the following effect can be obtained in this embodiment. Since an oxide film or a nitride film can be formed during an erasing operation, the insulation deterioration due to an excessive voltage application during the erase operation can be suppressed, and thus the improvement of the repetition characteristic is expected. Also, since the resistance range of the usable tellurium compound film can be widened, the material selection range can be widened. By this, the same effect can be obtained in a memory device having the above-described memory component 3.

EXAMPLES

Hereinafter, detailed examples of the present invention will be described.

Examples 1 to 6

In the same manner as the above-described embodiments, a memory component 1 as illustrated in FIG. 1 was produced. First, on the lower electrode 10 made of tungsten (W), a memory layer 20 and an upper electrode 30 were formed using a sputtering device. The diameter of the electrode was 50 to 300 nmϕ. Also, a layer made of an alloy was simultaneously formed using a target of constituent elements. Then, by etching the surface of the upper electrode 30, a interconnection layer (Al layer) with a thickness of 200 nm was formed so that the interconnection layer becomes in contact with a contact portion for connecting an external circuit for giving an intermediate electric potential (Vdd/2). Thereafter, a heating process at 200° C. for two hours was performed as a post-annealing process in a vacuum heat-treatment furnace. By doing this, memory cell arrays 2 as illustrated in FIGS. 2 and 3 were produced with different compositions and layer thicknesses as in the following examples 1 to 5.

Comparative Examples 1 to 3

In the same manner as the above-described embodiments, except for the high resistance layer, a memory component was produced. At that time, on the lower electrode made of tungsten nitride (WN), a high resistance layer made of aluminum oxide (Al—O), gadolinium oxide (Gd—O), or silicon (Si) was formed with a thickness of 1.4 nm or 20 nm. The high resistance layer, in the case of an oxide film, was formed by forming, for example, a metal gadolinium (Gd) layer with a thickness of 1 nm by a DC magnetron sputter and then oxidizing the metal gadolinium (Gd) layer for 60 seconds by an RF plasma on the conditions of chamber pressure of 0.25+ 0.05 Pa, ArO2 atmosphere, and input power of 50 W. Then, an ion source layer composed of Cu11Te29Zr11Al42Ge7 was formed with a thickness of 45 nm. Thereafter, an upper electrode made of zirconium (Zr) was formed. Then, by etching the surface of the upper electrode, an interconnection layer (Al layer) was formed with a thickness of 200 nm in the same manner as Examples 1 to 5. Then, heat treatment was performed at 200° C. for one hour in a vacuum heat-treatment furnace. By doing this, memory cell arrays were produced and designated as Comparative examples 1 to 3.

The compositions and film thicknesses of "lower electrode/high resistance layer/ion source layer/upper electrode" in Examples 1 to 5 and Comparative examples 1 to 3 are as follows.

Example 1

W/Al1Te1 (8 nm)/Cu11Te29Zr11Al42Ge7 atom % (45 nm)/Zr (20 nm)

Example 2

TiN/Mg1Te1 (4 nm)/Cu10Te30Ge7Zr11Al42 atom % (45 nm)/W (20 nm)

Example 3

W/Zn1Te1 (6 nm)/Te40Zr18Al42 atom % (45 nm)/Zr (20 nm)

Example 4

TiN/Mg1Te1 (7 nm)/Cu13Te25Ge6Zr14Mg42 atom % (45 nm)/W (20 nm)

Example 5

TiN/Al4Te6+Cu15 atom % (7 nm)/Cu10Te30Ge7Zr11Al42 atom % (45 nm)/W (20 nm)

Comparative Example 1

WN/AlOx (1.4 nm)/Cu11Te29Zr11Al42Ge7 atom % (45 nm)/Zr (20 nm)

Comparative Example 2

WN/GdOx (1.4 nm)/Cu11Te29Zr11Al42Ge7 atom % (45 nm)/Zr (20 nm)

Comparative Example 3

WN/Si (20 nm)/Cu11Te29Zr11Al42Ge7 atom % (45 nm)/Zr (20 nm)

Experiment 1

With respect to a memory component cell array in Examples to 5 and Comparative examples of 1 to 3, an upper interconnection connected to the upper electrode 30 was set as an intermediate electric potential of Vdd/2, and the gate electrode of the selected memory cell, that is, the word line WL was made in anon state by applying a voltage. Also, a "write operation", which applies a voltage with a pulse width of 100 ns, current of 130 μA, and voltage of 3.0V to the electrode that is connected to one of the source/drain regions 43 of the transistor Tr that is not connected to the memory component 10, that is, the bit line BL, was performed with respect to 20 elements (10 elements×2 columns) in the memory cell array. Then, the "erase operation" was performed by applying a voltage, which is opposite to the voltage during the "write operation", to the gate electrode as increasing the voltage from 0V to 3.0V with a pitch of 0.05V, and the resistance values for the respective voltages were measured. The results, which were added to the results of data maintenance characteristics to be described later, are shown in FIGS. 5A to 7C. At this time, the respective values in the characteristic diagram are average values of the 60-bit measurement results.

The erase operation starts in the neighborhood of 1V as increasing the erase voltage from 0V, and the resistance value is increasing. This increase of the resistance value stops at a certain voltage, and at that time point, the erasing has been performed to be in the initial film forming state. In the case where the initial state is restored in a lower voltage, it is considered that the erase characteristics are good, and the erase characteristics of the respective elements can be evaluated from the voltage at which the resistance value becomes constant.

Also, in the memory component cell array in Examples 1 to 5 and Comparative examples of 1 to 3, a high-temperature acceleration maintenance test that maintained in an oven at 130° C. for one hour was performed after the write operation was stopped in a state where 180 bits in total were written on the conditions of a pulse applying time of 250 ps to 100 ms, current of 15 μA to 200 μA, and voltage of 3.0V. The data maintenance characteristics were evaluated by comparing the resistance values before and after the high-temperature acceleration maintenance test. As the change of the resistance values becomes smaller, it is considered that the write maintenance characteristics become higher.

In any case of Examples 1 to 5 in which tellurium (Te) is included in the high resistance layer 22, good erase characteristics and write maintenance characteristics appear in comparison to Comparative examples 1 to 3. According to the erase characteristics in Comparative examples 1 and 2 in which an oxide film is used in the high resistance layer 22, the resistance value when an erase voltage of 1.5V is applied returns only to the resistance value in the range of about 1/several tens to 1/100 of the initial resistance. Also, as seen from the result of write maintenance characteristics, the resistance state after the high-temperature acceleration maintenance test is not maintained in the low resistance state equal to or more than 30 kΩ. In Comparative example 3 in which the high resistance layer 22 uses silicon (Si), the resistance value is abruptly lowered when a voltage of about 1.6V is applied. It is considered that this is caused by insulation breakage. Also, as the result of the write maintenance characteristics, in the same manner as in Comparative examples 1 and 2, the resistance state after the high-temperature acceleration maintenance test is not maintained in the low resistance state equal to or more than 30 kΩ.

By contrast, according to the erase characteristics in Examples 1 to 5 in which the high resistance layer 22 includes tellurium (Te), the resistance value returns to the initial resistance value in the neighborhood of 1.2V. Also, as the write maintenance characteristics, it can be seen that the data is maintained even at the write resistance of about 100 kΩ.

Also, since the improvement of the erase characteristics and the write maintenance characteristics as described above are shown in various tellurium compounds, it is considered that such characteristics are shown in the whole compounds having tellurium as their main component rather than in a specified tellurium compound. As in Example 5, there is no problem even though other metal elements such as copper (Cu) and the like are included in the compound, and by rather adding copper (Cu) (in Example 5, 15 atom % of copper (Cu) was added), it may be said that the write maintenance characteristics are somewhat improved. Also, the compositions of the elements used in the ion source layer 21 are not specially limited.

The reason why the write maintenance characteristics are improved is that the metal element, such as aluminum (Al) or copper (Cu), diffused into the high resistance layer 22 during the low resistance state is stable in the tellurium compound film rather than in the oxide film. The metal element inside the ion source layer 21 is deoxidized on the cathode electrode during a writing operation, and is extracted in a metal state in form of a filament in the low resistance state after the writing. By this, it is considered that the write state is realized. The stability of the metal element in the form of a filament is greatly influenced by the reaction with the elements inside the high resistance layer 22 in the neighborhood. As in Comparative examples 1 and 2, if an oxide exists in the neighborhood of the metal element in the form of a filament, the metal element is easily oxidized to be in high resistance state. By contrast, in the case where the high resistance layer 22 is formed of a compound having tellurium (Te) as a main component as in Examples 1 to 5, tellurium has a low oxidization speed of the metal element, and the metal element in the form of a filament stably exists. Also, it is considered that phase separation of the high resistance layer 22 and the filament is difficult to be realized. The difference in oxidization speed is related to the difference in electronegativity of the compounds. As described above, the absolute values of the electronegativity in the chalcogenide compound are heightened in the order of tellurium<selenium<sulfur<oxygen. Due to this, the metal element in the form of a filament is stabilized in the high resistance layer 22 that is formed of a compound having tellurium (Te) having low electronegativity as the main component rather than oxygen as in Examples 1 to 5, and thus the write maintenance characteristics are improved. Further, from this, in the case where no oxygen exists in the high resistance layer 22, it is considered that the write maintenance characteristics are best.

The reason why the erase characteristics are improved is that the tellurium compound film has a weak bonding force with the metal element in comparison to the oxide film or a film made of a silicon compound, and thus the movement of the re-ionized metal element to the ion source layer 21 in the erase operation is facilitated. Also, in the chalcogenide compound including tellurium (Te), a switching phenomenon due to a voltage so called OTS (Ovonic Threshold Switching) exists. Accordingly, the OTS is realized in the neighborhood of 1.2V, the current abruptly flows to accelerate the reaction by the erase.

Examples 6 to 8

In the same manner as the Examples 1 to 5, a memory component 1 as illustrated in FIG. 1 was produced, and then a memory cell array 2 as illustrated in FIGS. 2 and 3 was produced and designated as Examples 6 to 8. In this case, AlTe which is the high resistance layer 22 is an amorphous film and can take various compositions. Due to this, the diffusion of aluminum (Al) into the inside of AlTe is suppressed, the post-annealing is not performed in Examples 7 and 8 so that the composition is not changed, and only a minimum heating at 110° C. for two minutes is performed in the interconnection process. This is because the dependency of compounds is to be examined more correctly although an influence of the AlTe composition dependency before the annealing remains even at high temperature equal to or more than 200° C.

The compositions and film thicknesses of "lower electrode/high resistance layer/ion source layer/upper electrode" in Examples 6 to 8 are as follows.

Example 6

W/AlTe (8 nm)/Cu11Te29Zr11Al42Ge7 atom % (45 nm)/Zr (20 nm) (no post-annealing)

Example 7

W/Al4Te6 atom % (8 nm)/Cu11Te29Zr11Al42Ge7 atom % (45 nm)/Zr (20 nm)

Example 8

W/Al3Te7 atom % (8 nm)/Cu11Te29Zr11Al42Ge7 atom % (45 nm)/Zr (20 nm)

Experiment 2

The write maintenance characteristics and the erase characteristics were evaluated by performing the high-temperature acceleration maintenance test and the erase voltage measurement in the same procedure as Experiment 1 with respect to Examples 6 to 8 in which the AlTe composition of the high resistance layer 22 was changed. The erase characteristics and the data maintenance characteristics in Examples 6 to 8 are illustrated in FIGS. 8A to 9C. In this case, as the erase characteristics, the 60-bit measurement results are illustrated.

As illustrated in FIGS. 8A to 9C, even if the composition of AlTe of the high resistance layer 22 is changed, the improvement of the write maintenance characteristics and the erase characteristics are maintained. Particularly, it can be seen that as the ratio of tellurium (Te) is heightened, the difference between the erase characteristics is suppressed. Although there is no problem even though the high resistance layer 22 is composed of only tellurium (Te) before the annealing, it is not known to what degree the aluminum (Al) permeates, and thus the description thereof will be omitted.

Figure 10:
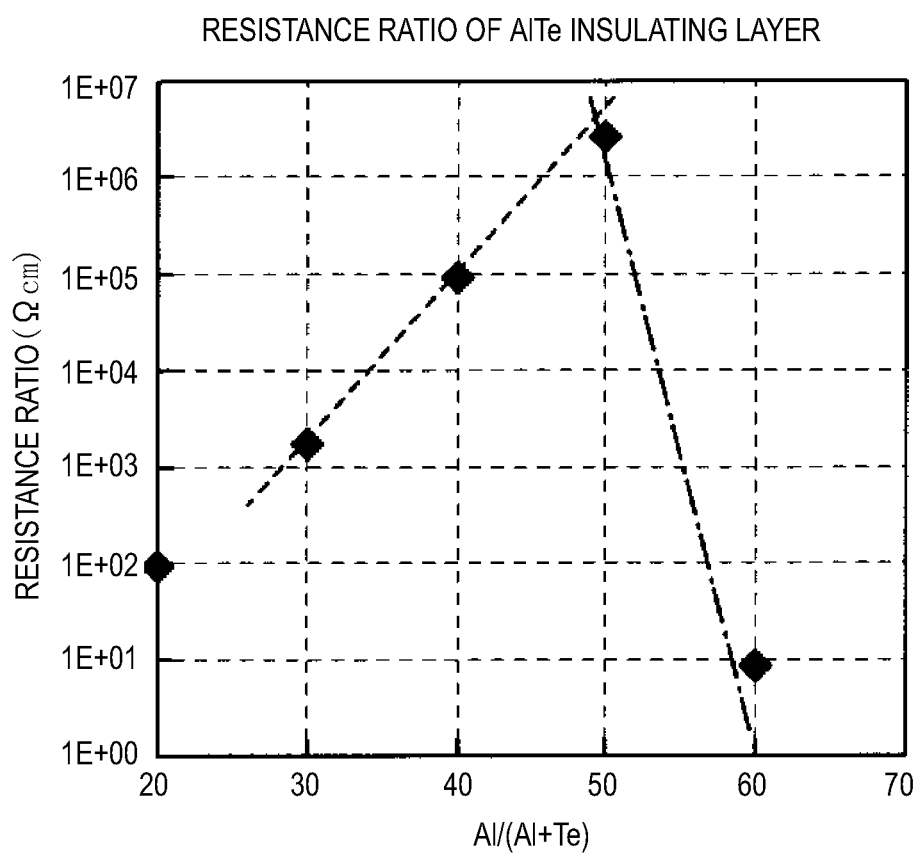
FIG. 10 is a characteristic diagram indicating the resistance ratio of a memory component according to experiment 2.

FIG. 10 is a characteristic diagram illustrating the relationship between the resistance ratio of an AlTe film and the ratio of aluminum (Al) included in the AlTe film. Here, a desirable composition of AlTe will be considered. If the initial resistance is set to 10MΩ under the assumption of a miniaturized element of 5 nmt×10 nmφ, the resistance ratio may be equal to or more than 10 Ωcm. Accordingly, the ratio of aluminum (Al) that is included inside AlTe in the case where the high resistance layer made of AlTe is used as a single-layer is preferably equal to or more than 20 atom % and equal to and less than 60 atm %.

Examples 9 to 12

In Examples 9 to 12, the memory component 3 as illustrated in FIG. 4 was produced in the same manner as in Examples 1 to 5. The GeTeAl film that was used in the first high resistance layer 62A and the second high resistance layer 62B was made of Ge1Te4, and aluminum (Al) permeated by thermal diffusion. The oxide film (or nitride film) of the first high resistance layer 62A or the second high resistance layer 62B was formed by a reactive sputter. Also, the amount of oxygen (or nitrogen) by the reactive sputter was not necessarily clear, but oxygen (or nitride) in a region where oxidization (or nitridization) was sufficiently performed was introduced. Thereafter, the memory cell array 2 as illustrated in FIGS. 2 and 3 was prepared and designated as Examples 9 to 12.

The compositions and film thicknesses of "lower electrode/first high resistance layer (second high resistance layer) or second high resistance layer (first high resistance layer)/ion source layer/upper electrode" in Examples 9 to 12 are as follows.

Example 9

W/GeTeAl (4 nm)/GeAlTeOx (4 nm)/Cu11Te29Zr11Al42Ge7 atom % (45 nm)/Zr (20 nm)

Example 10

W/GeAlTeOx (4 nm)/GeTeAl (4 nm)/Cu11Te29Zr11Al42Ge7 atom % (45 nm)/Zr (20 nm)

Example 11

W/GeAlTeNx (4 nm)/GeTeAl (4 nm)/Cu11Te29Zr11Al42Ge7 atom % (45 nm)/Zr (20 nm)

Example 12

WN/Al3Te7 atom % (6 nm)/GdOx (1 nm)/Cu10Te30Ge7Zr11Al42 atom % (45 nm)/W (20 nm)

Experiment 3

The erase characteristics and the write maintenance characteristics by the composition of AlTe of the high resistance layer 42 were evaluated by measuring the erase characteristics and write maintenance characteristic using the same conditions as Experiment 1 with respect to Examples 9 to 12. The erase characteristics and the write maintenance characteristics in the respective elements are illustrated in FIGS. 11A to 11D.

As illustrated in FIGS. 11A to 11D, it can be seen that the erase characteristics and the write maintenance characteristics are improved in all examples. From this, even though the oxide film (or nitride film) in the related art is used as the high resistance layer 62, by adding a high resistance layer having tellurium (Te) as the main component to the high resistance layer 62, the erase characteristics and the write maintenance characteristics of the memory component 3 can be improved. Also, by making the high resistance layer 62 with a double-layer structure, it is sufficient if the sum of the resistance values of the two layers is equal to or more than 1MΩ even if the resistance value of one of the high resistance layers does not reach 1MΩ. Accordingly, in the second layer, for example, other high resistance materials, which are more stable than tellurium compounds, such as a carbon film, diamond, a fluorine film, and the like, can be used. Also, if the resistance value that is necessary for one layer is higher than the resistance value in the lower resistance state, there is no problem in applying the voltage, and thus the resistance value may be in the range of 40 lΩ to 100 kΩ.

In consideration of the position of the first high resistance layer 62A having tellurium (Te) as the main component, the following contents can be known from FIGS. 11A to 11D. In comparing the results in Examples 9 to 12, Examples 9 and 12, in which the first high resistance layer 62A having tellurium (Te) as the main component is in contact with the lower electrode 10, have more superior erase characteristics and write maintenance characteristics than Examples 10 and 11 in which the first high resistance layer 62A is in contact with the ion source layer 61. However, even in the case of Examples 10 and 11, the erase characteristics and the write maintenance characteristics are sufficiently improved in comparison to Examples 1 to 3 manufactured as an example in the related art. Also, by making a film having an element with high reaction property such as oxygen as the lowermost layer, the characteristic deterioration due to the diffusion of oxygen during the post-annealing can be suppressed. Also, in addition to the reactive sputter, for example, by using plasma oxidation or plasma nitridation, the high resistance layer can be produced, and thus it is possible to prepare the high resistance layer 62 having a good film quality. Accordingly, it may be preferable that the first high resistance layer 62A having tellurium (Te) as a main component is formed on the side of the ion source layer 61 from a manufacturing standpoint.

Although the embodiments and examples of the present invention have been described, the present invention is not limited thereto, and diverse modifications can be made.

For example, in the second embodiment and example, although the high resistance layer 62 has a double-layer structure of the first high resistance layer 62A and the second high resistance layer 62B, a three or more layered structure having high resistance layers having different compositions may be used instead. Accordingly, it is possible to supplement the defect of each layer so that the layer has a better accuracy. However, since the element resistance is increased with the increase of the number of layers of the high resistance layer, the voltage for writing may be increased. In practice, it is preferable to reduce the difference in resistance between the initial states or the erase states with the minimum number of high resistance layers. As a material of the high resistance layer after the third layer, in the same manner as the first high resistance layer 62A and the second high resistance layer 62B, it is preferable that the material is made of an oxide or nitride that includes at least one kind of element selected from a rare earth element group consisting of yttrium (Y), lanthanum (La), neodymium (Nd), samarium (Sm), gadolinium (Gd), terbium (Tb), and dysprosium (Dy), or an oxide or nitride that includes at least one kind of element selected from a group consisting of silicon (Si), aluminum (Al), titanium (Ti), and hafnium (Hf). Also in this case, the it is preferable that the neighboring high resistance layers in the lamination direction is made of an oxide or a nitride that includes elements having different physical properties such as atomic weight, atom radius, and the like, or an oxide or a nitride having different properties such as different wetting from the ion source layer 21, and the like. This is because much more great complementary effect can be obtained.

Also, for example, in the first and second embodiments, detailed configuration of the memory components 1 and 3 and the memory cell array 2 has been exemplified. However, it is not necessary that all layers are provided, or another layer may be further provided.

Also, for example, in the above-described embodiments and examples, the materials of the respective layers, the film forming method, the film forming conditions, and the like are not limited, and other materials or other film forming methods may be used. For example, to the ion source layer 21, other transition metal elements, for example, titanium (Ti), hafnium (Hf), vanadium (V), Niobium (Nb), tantalum (Ta), chrome (Cr), molybdenum (Mo), and tungsten (W), may be added within a range in which the composition ratio is not destroyed. Also, nickel (Ni) may be added other than copper (Cu), silver (Ag) or zinc (Zn).

The present application contains subject matter related to that disclosed in Japanese Priority Patent Application JP 2010-009457 filed in the Japan Patent Office on Jan. 19, 2010, the entire contents of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A memory component comprising:
a first electrode;
a second electrode; and
a memory layer between the first and second electrodes, wherein:
the memory layer includes (a) on a first electrode side thereof, a resistance change layer that is composed of a plurality of layers, at least one of the plurality of layers including tellurium (Te) as the chief component among anion components, and (b) on a second electrode side thereof, an ion source layer with at least one kind of metal element and at least one kind of chalcogen element selected from the group consisting of tellurium (Te), sulfur (S) and selenium (Se),
the memory component is configured such that an ionized metal element from the ion source layer is diffused into the resistance change layer to change a resistance of the resistance change layer from a high resistance state to a low resistance state, and
a first one of the plurality of layers of the resistance change layer has an Al—Te compound, an Mg—Te compound, or a Zn—Te compound as a main component, and a second one of the plurality of layers of the resistance change layer has oxygen (O) or nitrogen (N) as a main component.

2. The memory component according to claim 1, wherein the first one of the plurality of layers is at the first electrode side, and the second one of the plurality of layers is at the ion source layer side.

3. The memory component according to claim 1, wherein the first one of the plurality of the layers of the resistance change layer is at the ion source layer side, and the second one of the plurality of the layers of the resistance change layer is at the first electrode side.

4. The memory component according to claim 1, wherein the resistance change layer has a resistance value that is higher than that of the ion source layer when a predetermined voltage pulse or a current pulse is applied thereto through the first electrode and the second electrode.

5. The memory component according to claim 1, wherein the at least one kind of metal element in the ion source layer includes aluminum (Al).

6. The memory component according to claim 1, wherein a conduction path is formed inside the resistance change layer when the ionized metal element is diffused from the ion source layer into the resistance change layer due to application of voltages to the first electrode and the second electrode to change the resistance of the resistance change layer from the high resistance state to the low resistance state.

7. The memory component of claim 1, wherein the plurality of layers of the resistance change layer is two layers.

8. The memory component of claim 7, wherein:
a first layer of the two layers includes Te as the chief component among the anion components and is in contact with the first electrode, and a second layer of the two layers is in contact with the ion source layer.

9. The memory component of claim 1, wherein the plurality of layers of the resistance change layer is more than two layers.

10. The memory component of claim 1, wherein a resistance value of the resistance change layer is a sum of resistance values of individual layers within the plurality of layers.

11. The memory component of claim 1, wherein a layer of the plurality of layers that includes Te as the chief component among the anion components is in contact with the first electrode.

12. The memory component of claim 1, wherein the at least one kind of metal element in the ion source layer includes copper (Cu).

13. The memory component of claim 1, wherein the at least one kind of metal element in the ion source layer includes aluminum (Al) and copper (Cu).

14. A memory device comprising:
- a plurality of memory components each of which has a first electrode, a second electrode, and a memory layer between the first and second electrodes; and
- a pulse applying means for selectively applying voltage or current pulses to the plurality of memory components, wherein:
- (i) the memory layer in each memory component includes (a) on a first electrode side of the memory layer, a resistance change layer that is composed of a plurality of layers, at least one of the plurality of layers including tellurium (Te) as the chief component among anion components, and (b) on a second electrode side of the memory layer, an ion source layer with at least one kind of metal element and at least one kind of chalcogen element selected from the group consisting of tellurium (Te), sulfur (S) and selenium (Se),
- (ii) each memory component is configured such that an ionized metal element from the ion source layer is diffused into the resistance change layer to change a resistance of the resistance change layer from a high resistance state to a low resistance state, and
- (iii) in each memory component, a first one of the plurality of layers of the resistance change layer has an Al—Te compound, an Mg—Te compound, or a Zn—Te compound as a main component, and a second one of the plurality of layers of the resistance change layer has oxygen (O) or nitrogen (N) as a main component.

* * * * *